United States Patent
Wan et al.

(10) Patent No.: US 7,727,800 B2
(45) Date of Patent: Jun. 1, 2010

(54) HIGH PRECISION DIE BONDING APPARATUS

(75) Inventors: Ming Yeung Luke Wan, Hong Kong (CN); Wing Fai Lam, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 313 days.

(21) Appl. No.: 11/301,121

(22) Filed: Dec. 12, 2005

(65) Prior Publication Data

US 2007/0134904 A1    Jun. 14, 2007

(51) Int. Cl.
*H01L 21/00* (2006.01)
(52) U.S. Cl. .............................. 438/106; 257/E21.088; 29/721
(58) Field of Classification Search .................. 438/106, 438/266; 29/721
See application file for complete search history.

(56) References Cited

U.S. PATENT DOCUMENTS

2004/0244915 A1 * 12/2004 Lam et al. .................... 156/510

* cited by examiner

*Primary Examiner*—Thao X Le
*Assistant Examiner*—Elias Ullah
(74) *Attorney, Agent, or Firm*—Ostrolenk Faber LLP

(57) ABSTRACT

A die bonding apparatus and a bonding method are provided wherein the apparatus comprises a bond head movable between a supply of semiconductor dice and a die bonding site, a pick-up tool attached to the bond head for holding a die to be bonded at the die bonding site and an optical assembly positioned for viewing an orientation of the die bonding site. The bond head is configured such that an orientation of the die being held by the pick-up tool between the optical assembly and the die bonding site is viewable by the optical assembly, whereby the orientation of the die may be aligned with the orientation of the die bonding site.

10 Claims, 3 Drawing Sheets

HIGH PRECISION DIE BONDING APPARATUS

FIELD OF THE INVENTION

The invention relates to an apparatus for attaching a die accurately on a mounting surface and creating a bond therebetween during a semiconductor packaging process.

BACKGROUND AND PRIOR ART

During the production of semiconductor dice or chips, many semiconductor dice are formed together on a single wafer. The wafer is then cut to separate the individual dice. Each of these semiconductor dice should then be individually mounted onto a support surface for further processing by utilizing a die bonding process. Thereafter, electrical connections are created between the dice and external devices, and the dice are later encapsulated with a plastic compound to protect them from the environment.

In prior art die bonders utilized in the said die bonding process, each individual die is usually picked up by a bond arm from the wafer and then transported to a substrate to perform attachment of the die onto the substrate. FIG. 1 is an isometric view of a die bonder 100 of the prior art. The die bonder 100 generally comprises a die bond head 102 which has an air nozzle 104 for creating a suction force to pick up a semiconductor die 106 from a wafer platform 108 holding the die 106. The die 106 is then transported and bonded onto a substrate 110.

In order to place the die 106 correctly and accurately onto the substrate 110, visual alignment is conducted with a vision system, usually comprising a first optical system 112 located over the wafer platform 108 and a second optical system 114 located over the substrate 110. Visual alignment is performed to capture images of the die 106 on the wafer platform 108 and the substrate 110. Positioning of the bond head 102 and air nozzle 104 will be performed according to the image captured of the die 106, which references an alignment pattern or fiducial mark on the die 106 for this purpose. Since the alignment pattern or fiducial mark of the die 106 is located on an upper side of the die facing the first and second optical systems 112, 114, these die bonders 100 allow the first optical system 112 to capture an image of the die 106 before the bond head 102 is moved into position to pick up the die 106, and to adjust the orientation of the die 106 according to the image taken of the substrate 110, before placing the die 106 onto the substrate 110.

A problem with this approach is that any error or unexpected movement of the die 106 that may be introduced during the die pick-up process after the image of the die 106 has been captured cannot be corrected or compensated for by the vision system. For example, an attraction surface of the air nozzle 104 and the die 106 may not be co-planar as a result of this error. The co-planarity between the air nozzle 104 and the die 106 is one of the major concerns during the pick-up process. When such co-planarity is not achieved, the position and angle of the die 106 will likely be shifted and rotated during the pick up process. It would be desirable to perform visual alignment of a die 106 after it has been picked up by the bond head 102 and before placement onto a substrate 110 to avoid errors introduced during die pick-up.

Furthermore, said prior art die bonders 100 that recognize the die 106 and the substrate 110 using two individual optical systems at two different locations require calibration. Calibration is needed to relate the coordinates as viewed by the optical systems with the coordinates of a bond head table (not shown) controlling positioning of the bond head 102. Any calibration error will have a direct adverse effect on the accuracy of the coordinate relationship existing between the two optical systems 112, 114 and the bond head table, and this will affect die bonding placement accuracy.

Also, during machine operation, the temperature of the bonding apparatus typically varies. Hence, the bond head table and optical systems 112, 114 may be heated up by their respective motors when the machine is running fast and may be cooled down when the machine is running slow or stopped. Thermal expansion or contraction will change the aforementioned relationship established between the optical systems and bond head table during calibration, thus affecting the placement accuracy as well. Generally, the further the two optical systems 112, 114 are separated, the worse the calibration error. This is because the calibration method usually involves the use of the bond head table to translate a calibration pattern from one optical system to the other. The distance of this movement should thus be accurately defined. The longer the distance, the larger is the effect of thermal error and table motion error.

Some die bonders may instead employ a movable optical system which can move from the location of the wafer platform 108 to the location of the substrate 110. The advantage of this design is that the images of both the die alignment pattern and the substrate alignment pattern can be captured with just one optical system, so that calibration for two individual optical systems need not be performed. Nevertheless, any motion error of such a movable optical system that is introduced when the optical system is moving between the location of the platform 108 to the location of the substrate 110 will also affect the placement accuracy.

When handling dice that are large or long in length, it will generally be better to employ an optical system with a small field of view. This means that if the optical system cannot capture the image of the whole die, it will need to capture the alignment pattern at one corner of the die 106 first and then move to capture the alignment pattern at an opposite corner of the die 106. In this way, the die centre position and the angle of rotation of the die can be calculated. A small field of view will provide the vision system with a higher resolution and thus higher pattern recognition (PR) accuracy. However, the motion accuracy of the optical system will also play an important part in the overall placement accuracy during die bonding. As explained above, another potential source of error may be introduced if positioning of the optical system is not sufficiently accurate. It would be desirable to minimize motion of the optical system used for visual alignment to avoid inaccuracy introduced from motion of the optical system.

SUMMARY OF THE INVENTION

It is therefore an object of the invention to seek to avoid at least some of the above disadvantages of the prior art while achieving a higher level of die bonding precision.

According to a first aspect of the invention, there is provided a die bonding apparatus comprising: a bond head movable between a supply of semiconductor dice and a die bonding site; a pick-up tool attached to the bond head for holding a die to be bonded at the die bonding site; and an optical assembly positioned for viewing an orientation of the die bonding site; wherein the bond head is configured such that an orientation of the die being held by the pick-up tool between the optical assembly and the die bonding site is viewable by the optical assembly, whereby the orientation of the die may be aligned with the orientation of the die bonding site.

According to a second aspect of the invention, there is provided a method for bonding a die comprising the steps of: viewing a die bonding site with an optical assembly for determining an orientation of the die bonding site; picking up a die from a supply of semiconductor dice with a pick-up tool attached to a bond head; positioning the die held by the pick-up tool between the optical assembly and the die bonding site; viewing the die with the optical assembly for determining an orientation of the die while the die is between the optical assembly and the die bonding site; aligning the orientation of the die with the orientation of the die bonding site; and thereafter bonding the die at the die bonding site.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of several embodiments of die bonding apparatus in accordance with the invention will now be described with reference to the accompanying drawings, in which.

DETAILED DESCRIPTION OF THE PREFERRED EMBODIMENTS OF THE INVENTION

Figure 1:
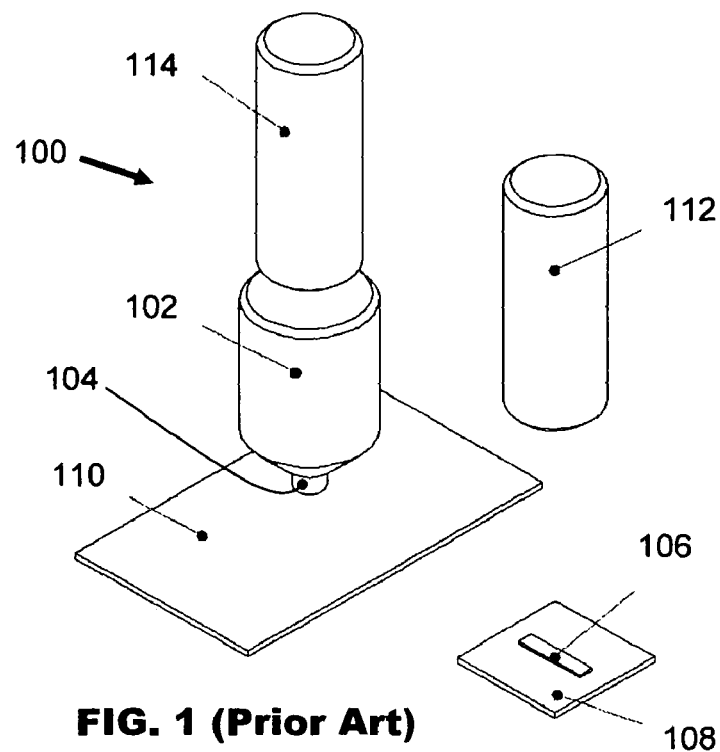
FIG. 1 is an isometric view of a die bonder of the prior art.
Figure 2:
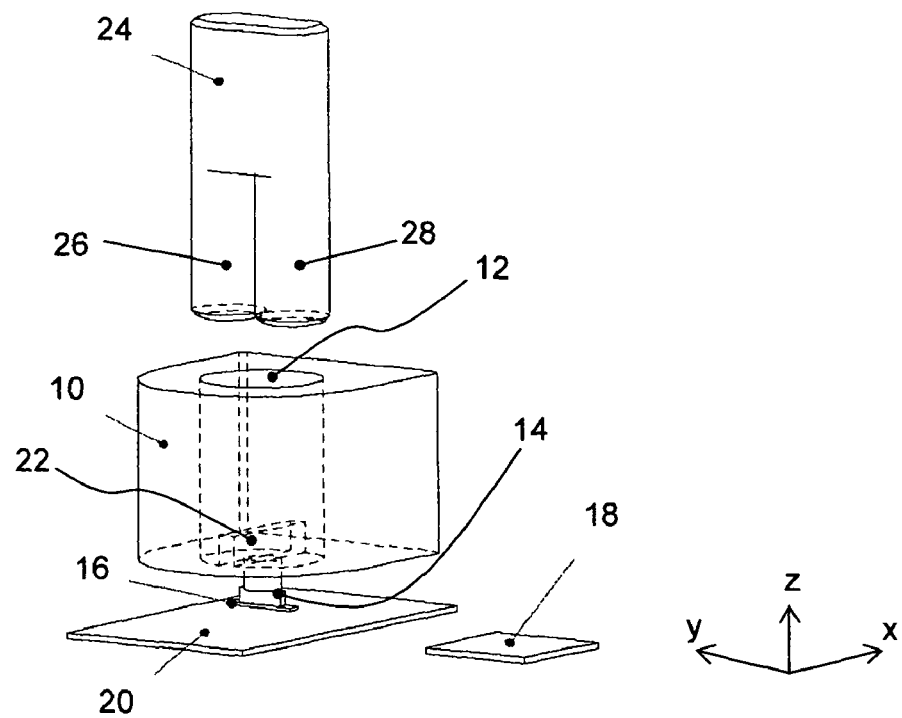
FIG. 2 is an isometric view of a die bonding apparatus including two optical systems according to a preferred embodiment of the invention.

FIG. 2 is an isometric view of a die bonding apparatus including two optical systems 26, 28 according to a preferred embodiment of the invention. The apparatus comprises a hollow bond head 10 that has a cavity 12 extending vertically through the body of the bond head 10. The bond head 10 supports and controls a pick-up tool 14, such as a collet, which is configured to pick up a die 16 from a supply of semiconductor dice at a wafer platform 18 by vacuum suction or by gripping.

The bond head 10 is movable between the wafer platform 18 and a die bonding site. After the die 16 is picked up, it is then placed onto the die bonding site that is located on a substrate 20, where it is bonded. The pick-up tool 14 comprising a vacuum nozzle or gripper is made with a shorter width than the die 16 so that the four corners of the die 16 are not covered by the pick-up tool 14. The attachment of the pick-up tool 14 to the bond head 10 is preferably by way of a support structure, such as a crossbeam 22 extending transversely across an opening of the cavity 12 at the bottom of the cavity 12.

The bond head 10 is driven by a three-axis table (not shown) so that it is drivable to move in the x and y axes parallel to the plane of the substrate 20, and in the z axis perpendicular thereto. The bond head 10 can also be rotated about the z axis so that the orientation angle of the die 16 can be adjusted during a bonding operation to align the orientation of the die 16 to the die bonding site.

The cavity 12 is preferably cylindrical in shape and oriented with its longitudinal axis being substantially normal to the plane of the substrate 20, in particular the die bonding site. An optical assembly, which may be in the form of a dual-optics assembly 24, comprising a first optical system 26 and a second optical system 28, is positioned for viewing an orientation of the die bonding site on the substrate 20. In FIG. 2, the dual-optics assembly 24 is positioned over one opening of the cavity 12 of the bond head 10 after the orientation of the die bonding site has been determined. The viewing axis of the dual-optics assembly 24 is aligned with the longitudinal axis of the cavity 12 in order to capture an image of a die 16 held by the pick-up tool 14 at an opposite opening of the cavity 12. The cavity 12 should have a sufficient width so that the first and second optical systems 26, 28 can both simultaneously view the die 16 through the cavity 12. The bond head 10 is thus configured such that the orientation of the die 16 being held by the pick-up tool 14 between the optical assembly and the die bonding site is viewable by the optical assembly.

Figure 3:
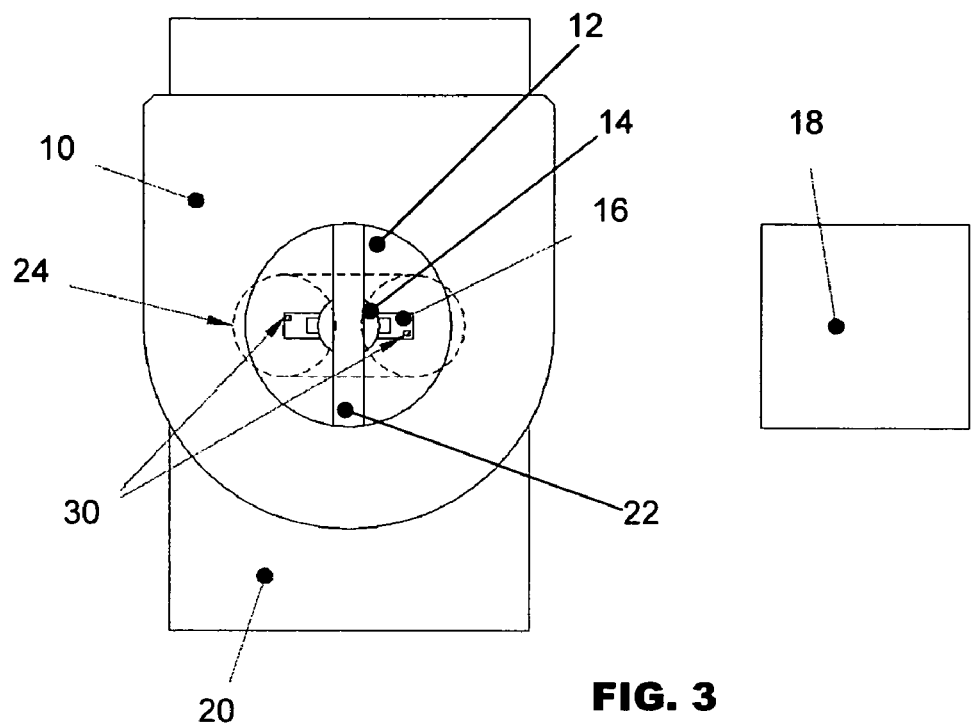
FIG. 3 is a plan view of the die bonding apparatus illustrated in FIG. 2.

FIG. 3 is a plan view of the die bonding apparatus illustrated in FIG. 2. The dual-optics assembly 24 is shown in outline, and its viewing axis is aligned with the longitudinal axis of the cavity 12 so that a die 16 held by the pick-up tool 14 can be viewed through the cavity 12. Looking down at the die 16, alignment patterns formed at the corners of the die 16, which may be in the form of fiducial marks 30, are viewable simultaneously by the optical systems 26, 28. These alignment patterns are commonly formed to aid in the alignment of the die 16 by a vision system. Each optical system 26, 28 is preferably arranged to view one end of the die 16, and the bond head 10 is configured such that each end of the die 16 is viewable by the respective optical system 26, 28 simultaneously. The crossbeam 22 should be sufficiently narrow, and in particular its width should be narrower than the length of the die 16, so as not to obstruct the optical systems' views of the fiducial marks 30.

The bond head 10 first picks up a die from the wafer platform 18. At the same time, the dual-optics assembly 24 which is positioned over the substrate captures an image of the die bonding site on the substrate 20 to determine its orientation. The bond head 10 is then moved to a position over the substrate 20 but underneath the dual-optics assembly 24, so that the die 16 is held by the pick-up tool 14 between the dual-optics assembly 24 and the die bonding site. The fiducial marks 30 can be viewed through the cavity 12 by the optics assembly 24 so as to capture an image of the fiducial marks 30 on the die 16 for visual alignment. After viewing the fiducial marks 30, the current orientation of the die 16 is determined, after which the bond head 10 or pick-up tool 14 may be moved for compensation to align the orientation of the die 16 with the orientation of the die bonding site. This may comprise movement along the x and y axes, or theta rotation about the z axis to orient the die 16 relative to the substrate 20 to achieve correct alignment for accurate placement on the substrate 20.

The position of the dual-optics assembly 24 may be fixed at a position above the substrate 20, or may be unfixed, depending on the design of a substrate table on which the substrate 20 is placed. If the substrate table is movable in both the x and y directions, then the position of the dual-optics assembly 24 is preferably fixed. However, if the substrate table can only move in the x direction (that is, the indexing direction), then if the substrate 20 contains several rows and columns of bond pads, the dual-optics assembly 24 may need to move in the y direction in order to capture images of the substrate's bond pads on different rows. Nevertheless, in order to maintain high placement accuracy, it is important to keep the dual-optics assembly 24 stationary above the bond pad on which a die is to be bonded after capturing the image of the substrate 20 and before capturing the image of the die 16. This means that the dual-optics assembly 24 does not move in the x-y plane after capturing the image of the substrate 20 and before capturing the image of the die 16, so that both the image of the substrate 20 and the image of the die 16 are referenced to the same optics table coordinates. Motion error of the table can thus be avoided or minimized.

Figure 4:
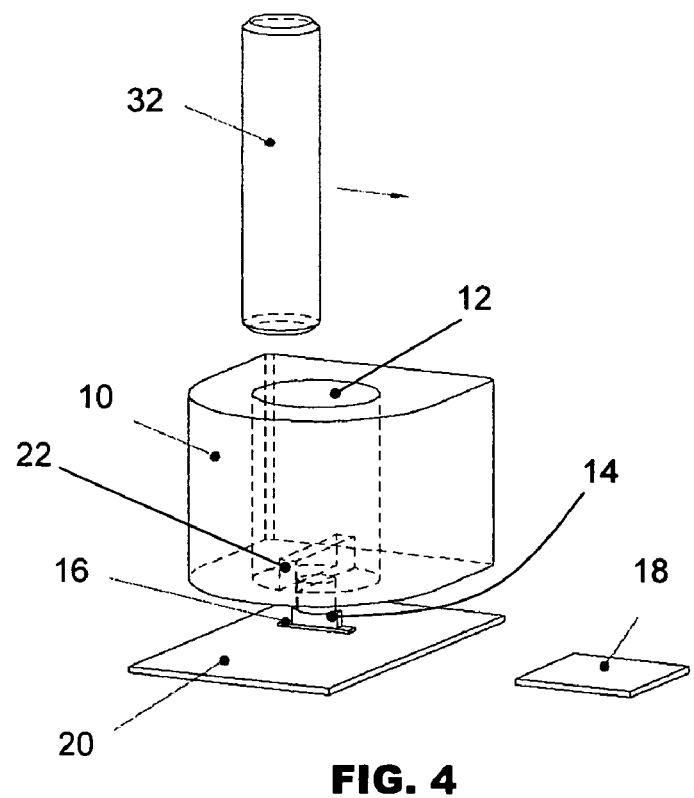
FIG. 4 is an isometric view of a die bonding apparatus including a single optical system according to an alternative preferred embodiment of the invention.

FIG. 4 is an isometric view of a die bonding apparatus including a single optical system 32 according to an alternative preferred embodiment of the invention. The apparatus comprises a hollow bond head 10 with a cavity 12 passing vertically through the bond head 10. The bond head 10 includes a pick-up tool 14 for holding a die 16, which is carried from a wafer platform 18 to a substrate 20. The pick-up tool 14 is supported by a crossbeam 22 extending across the cavity 12.

In this embodiment, there is single-optics assembly comprising only one optical system 32 for viewing the fiducial marks 30 on the die 16. Therefore, it is preferred that the single optical system 32 be movable between opposite ends of the die 16 to view the fiducial marks 30 located at the corners of the die 16 separately. Meanwhile, the single optical system 32 is still generally stationed above the substrate 20 to minimize its movement. A driving mechanism (not shown) for the single optical system 32 needs to drive the optical system 32 along the x and/or y axis, while the bond head 10 remains substantially stationary. Alternatively, the bond head 10 may move relative to the single optical system 32 while the system 32 remains stationary. Other aspects of the operation of this embodiment are substantially similar to the embodiment described in relation to FIG. 2, and they will not be repeated.

Figure 5:
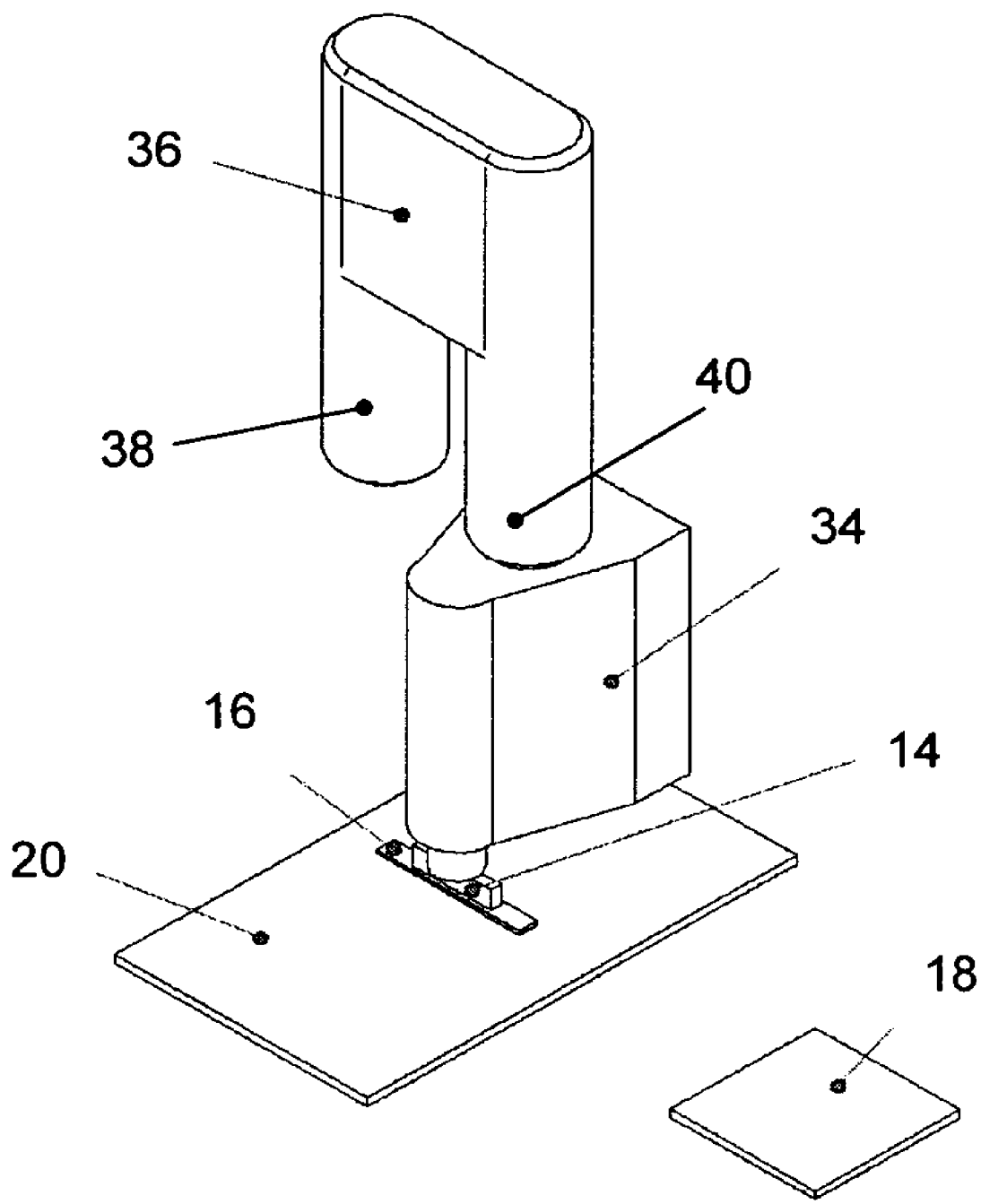
FIG. 5 is an isometric view of a die bonding apparatus comprising a narrow bond head according to another preferred embodiment of the invention.

FIG. 5 is an isometric view of a die bonding apparatus comprising a narrow bond head 34 according to another preferred embodiment of the invention. When the length of the die 16 is so long that the size of a cavity that were to be formed in the bond head would need to be made impracticably large, such a narrow bond head 34 may be used instead. In this embodiment, the die bonding apparatus comprises a bond head 34 with a body that is narrower than the length of the die 16 at a position where a pick-up tool 14 is attached to the bond head 34 along a field of view of an optical assembly so that portions of the die 16 that extend beyond the sides of the bond head 34 are viewable by the optical assembly. When the pick-up tool 14 picks up the long die 16, the four corners of the die 16 should extend beyond the edge of the bond head 34 so that an optical assembly can capture the images of the fiducial marks 30 from above the bond head 34. The bond head 34 is movable between a supply of semiconductor dice at wafer platform 18 and a substrate 20, for bonding a die 16 to the substrate 20.

Although the bond head 34 should be narrower than the length of the die 16 at the location of the pick-up tool 14 for holding the die 16, the whole of the bond head 34 need not be of the same width. In the illustrated embodiment in FIG. 5, a cross-sectional area of the bond head 34 along a plane that is parallel to a plane of the die bonding site is substantially triangular-shaped. The pick-up tool 14 is attached adjacent to a vertex of such triangular shape to ensure that the pick-up tool 14 is attached at substantially the narrowest portion of the bond head 34. The width of the bond head 34 may be larger towards the back of the bond head 34 to facilitate connections to other mechanisms.

An optical assembly in the form of a dual-optics assembly 36 is preferably positioned above the bond head 34 for viewing the die 16. The dual-optics assembly 36 comprises a first optical system 38 and a second optical system 40 located near to each other to view opposite corners of the die 16. The two optical systems 38, 40 are preferably spaced further apart from each other in comparison to the first embodiment described above to view the longer dice 16 and also to enable them to view down the sides of the bond head 34 to prevent their fields of view from being blocked by the bond head 34. As before, the optical systems 38, 40 simultaneously view fiducial marks 30 located at opposite corners of the die 16. The bonding sequence will be substantially the same as that described in relation to the previous embodiments and will not be repeated.

Although this embodiment of the invention is illustrated with a dual-optics assembly 36, it should be appreciated that a single-optics assembly such as that used in FIG. 3 is also applicable. However, in that case, it is preferable that the single-optics assembly is drivable to move from a location above one end of the die 16 to a position above an opposite end of the die 16 for viewing fiducial marks 30 that are at opposite corners of the die 16.

An advantage of the preferred embodiments of the invention described above is that images of both a substrate alignment pattern and die alignment pattern can be captured by the same optical assembly, so that the transformation error between different optical assemblies can be eliminated. When two different optical assemblies are used to capture images of die and substrate alignment patterns respectively, calibration is needed to determine the relationship between the two different optical coordinate systems, to be used to relate the coordinate information of one optical assembly to the coordinate information of the other. The accuracy of the calibration will directly affect the transformation accuracy, thus affecting the placement accuracy.

Although the dual-optics assemblies 24, 36 consist of two sets of lenses and cameras making calibration essential to find out the relationship between their respective optical systems, the calibration error will be relatively small as compared to prior art implementations. This is because the two optical systems are closely packed together which means thermal expansion problems would have minimal effect on the predetermined relationship between the systems. For example, by employing a pre-scaled calibration glass which allows the dual-optics assemblies 24, 36 to capture an image of separate alignment patterns on the glass simultaneously, one can easily calibrate the two optical systems without the aid of an X-Y table to move the optical systems. This means that the motion error encountered in common prior art calibration methods can be eliminated.

It should also be appreciated that visual alignment of the die 16 takes place above the die bonding position on the substrate 20. After capturing the image of substrate 20, the dual-optics assemblies 24, 36 can stay at the same x-y coordinates to wait for the bond head 10, 34 to transport the die 16 to the bonding position. This means the optics assemblies 24, 36 can capture the image of die alignment patterns without movement in the X-Y plane. This will also eliminate any motion error encountered with the optical assemblies 24, 36 and thus improve the placement accuracy.

Advantageously, since visual alignment of the die 16 takes place after the die pick-up process, any unexpected movement of the die 16 during the die pick-up process will not affect the placement accuracy.

Moreover, by employing the dual-optics assemblies 24, 36, images of alignment patterns or fiducial marks 30 at the corners of the die 16 can be captured simultaneously. Motion of the dual-optics assemblies 24, 36 can be eliminated. Therefore, the cycle time of the whole pick-and-place process can be reduced without sacrificing placement accuracy.

The invention described herein is susceptible to variations, modifications and/or additions other than those specifically described and it is to be understood that the invention includes all such variations, modifications and/or additions which fall within the spirit and scope of the above description.

The invention claimed is:

1. Method for bonding a die comprising the steps of:
viewing a die bonding site with an optical assembly for determining an orientation of the die bonding site;
picking up a die from a supply of semiconductor dice with a pick-up tool attached to a bond head, wherein the bond head includes a cavity extending therethrough;
positioning the bond head such that the die is held by the pick-up tool between the optical assembly and the die bonding site;
viewing the die with the optical assembly through the cavity by aligning the cavity with the optical assembly for determining an orientation of the die while the die is between the optical assembly and the die bonding site;
aligning the orientation of the die with the orientation of the die bonding site; and thereafter
bonding the die at the die bonding site,
the optical assembly being maintained in a stationary position above the die bonding site, during a time period between the step of viewing the die bonding site and the step of viewing the die, in order to maintain high placement accuracy.

2. Method for bonding a die as claimed in claim 1, wherein the cavity is substantially cylindrical in shape.

3. Method for bonding a die as claimed in claim 2, wherein a longitudinal axis of the cavity is substantially normal to the plane of the die bonding site, and the step of aligning the cavity with the optical assembly comprises aligning the longitudinal axis of the cavity with a viewing axis of the optical assembly.

4. Method for bonding a die comprising the steps of:
viewing a die bonding site with an optical assembly for determining an orientation of the die bonding site;
picking up a die from a supply of semiconductor dice with a pick-up tool attached to a bond head such that portions of the die extend beyond the sides of the bond head so as to be viewable by the optical assembly;
positioning the die held by the pick-up tool between the optical assembly and the die bonding site;
viewing the die with the optical assembly by aligning the sides of the bond head with the optical assembly to view the portions of the die that extend beyond the sides of the bond head for determining an orientation of the die while the die is between the optical assembly and the die bonding site;
aligning the orientation of the die with the orientation of the die bonding site; and thereafter
bonding the die at the die bonding site,
the portions of the die having alignment patterns on them.

5. Method for bonding a die as claimed in claim 4, wherein a width of the bond head at a location where the pick-up tool is attached is narrower than a length of the die being held by the pick-up tool along the field of view of the optical assembly.

6. Method for bonding a die as claimed in claim 5, wherein a cross-sectional area of the bond head along a plane that is parallel to a plane of the die bonding site is substantially triangular-shaped.

7. Method for bonding a die as claimed in claim 4, wherein the optical assembly comprises dual optical systems, and one optical system is arranged to view an end of the die simultaneously with the other optical system viewing another end of the die.

8. Method for bonding a die as claimed in claim 4, wherein the alignment patterns are fiducial marks.

9. Method for bonding a die comprising the steps of:
viewing a die bonding site with an optical assembly for determining an orientation of the die bonding site;
picking up a die from a supply of semiconductor dice with a pick-up tool attached to a bond head such that portions of the die extend beyond the sides of the bond head so as to be viewable by the optical assembly;
positioning the die held by the pick-up tool between the optical assembly and the die bonding site;
viewing the die with the optical assembly by aligning the sides of the bond head with the optical assembly to view the portions of the die that extend beyond the sides of the bond head for determining an orientation of the die while the die is between the optical assembly and the die bonding site;
aligning the orientation of the die with the orientation of the die bonding site; and thereafter
bonding the die at the die bonding site,
the portions of the die having alignment patterns on them, the optical assembly being maintained in a stationary position above the die bonding site, during a time period between the step of viewing the die bonding site and the step of viewing the die, in order to maintain high placement accuracy.

10. Method for bonding a die comprising the steps of:
viewing a die bonding site with an optical assembly for determining an orientation of the die bonding site;
picking up a die from a supply of semiconductor dice with a pick-up tool attached to a bond head such that portions of the die extend beyond the sides of the pick-up tool so as to be viewable by the optical assembly;
positioning the die held by the pick-up tool between the optical assembly and the die bonding site;
viewing the die with the optical assembly by aligning the sides of the bond head with the optical assembly to view the portions of the die that extend beyond the sides of the pick-up tool for determining an orientation of the die while the die is between the optical assembly and the die bonding site;
aligning the orientation of the die with the orientation of the die bonding site; and thereafter
bonding the die at the die bonding site,
the portions of the die having alignment patterns on them.

* * * * *